(12) United States Patent
Zhang et al.

(10) Patent No.: US 11,716,881 B2
(45) Date of Patent: Aug. 1, 2023

(54) DISPLAY PANEL AND DISPLAY DEVICE

(71) Applicant: Wuhan China Star Optoelectronics Technology Co., Ltd., Hubei (CN)

(72) Inventors: Guiyang Zhang, Hubei (CN); Guowei Zha, Hubei (CN)

(73) Assignee: Wuhan China Star Optoelectronics Technology Co., Ltd., Wuhan (CN)

(*) Notice: Subject to any disclaimer, the term of this patent is extended or adjusted under 35 U.S.C. 154(b) by 609 days.

(21) Appl. No.: 16/966,025

(22) PCT Filed: May 22, 2020

(86) PCT No.: PCT/CN2020/091771
§ 371 (c)(1),
(2) Date: Jul. 30, 2020

(87) PCT Pub. No.: WO2021/189632
PCT Pub. Date: Sep. 30, 2021

(65) Prior Publication Data
US 2023/0157091 A1     May 18, 2023

(30) Foreign Application Priority Data
Mar. 26, 2020   (CN) .......................... 202010225961.8

(51) Int. Cl.
| H01L 51/52 | (2006.01) |
| H10K 59/127 | (2023.01) |
| H10K 59/35 | (2023.01) |
| H10K 59/38 | (2023.01) |

(52) U.S. Cl.
CPC .......... *H10K 59/127* (2023.02); *H10K 59/35* (2023.02); *H10K 59/38* (2023.02)

(58) Field of Classification Search
CPC ....... H10K 59/127; H10K 59/35; H10K 59/38
See application file for complete search history.

(56) References Cited

U.S. PATENT DOCUMENTS

2019/0267357 A1    8/2019  Iguchi et al.
2020/0312925 A1*  10/2020  Xia ...................... H01L 25/167

FOREIGN PATENT DOCUMENTS

| CN | 108886050 | 11/2018 |
| CN | 109801903 | 5/2019 |
| CN | 109817109 | 5/2019 |
| CN | 109859646 | 6/2019 |
| CN | 109935599 | 6/2019 |
| CN | 109950288 | 6/2019 |
| CN | 110098215 | 8/2019 |
| CN | 209472640 | 10/2019 |
| CN | 110471211 | 11/2019 |

(Continued)

*Primary Examiner* — Donald L Raleigh

(57) ABSTRACT

A display panel and a display device are provided. The display panel includes a first display module and a second display module. The first display module includes a display region and a light-transmission region adjacent to the display region. The second display module is disposed in the light-transmission region, and is adjacent to the display region of the first display module. The second display module includes a plurality of pixel regions. Each of the pixel regions is provided with a self-luminous micro-light-emitting unit, and any adjacent two of the micro-light-emitting units are spaced apart from each other.

20 Claims, 5 Drawing Sheets

(56) References Cited

FOREIGN PATENT DOCUMENTS

| CN | 110491909 | 11/2019 |
| CN | 110646984 | 1/2020 |
| CN | 110703499 | 1/2020 |
| JP | 2009-229826 | 10/2009 |
| JP | 2000-091069 | 3/2020 |

* cited by examiner

DISPLAY PANEL AND DISPLAY DEVICE

RELATED APPLICATIONS

This application is a National Phase of PCT Patent Application No. PCT/CN2020/091771 having International filing date of May 22, 2020, which claims the benefit of priority of Chinese Patent Application No. 202010225961.8 filed on Mar. 26, 2020. The contents of the above applications are all incorporated by reference as if fully set forth herein in their entirety.

FIELD AND BACKGROUND OF THE INVENTION

The present disclosure relates to a field of display device technology, and more particularly to a display panel and a display device.

In a field of small and a medium-sized displays, full screen technology has become a key direction for current research and development. In other words, a focus of current research and development is finding a way to maximize a screen-to-body ratio of human-computer interaction interface.

A first generation full screen technology focuses on changing a screen size ratio from 16:9 to 18+:9. A second generation full screen further focuses on narrowing edges of screens. Flexible folding technology is even used to maximize a visible area. At present, another trend of the full screen technology is integrating optical sensors such as fingerprint identification, camera, facial recognition, and distance sensing into an active area (AA) of a display screen.

In a full screen mobile phone design, a screen-to-body ratio of a front screen is close to 100%, and there is no place for arranging the optical sensors. In order to arrange the optical sensors below the screen, it is necessary to define an opening hole above the optical sensors for satisfying a light transmittance of the optical sensors, so as to achieve a normal function of the optical sensors. This is known as "blind hole technology". However, an opening hole area cannot display images, resulting in image absence, such that the "blind hole technology" cannot be considered real full screen technology, as it merely increases the screen-to-body ratio and the optical sensors corresponding to an area of the display screen cannot display images. Hence, current display screens of the prior art are unable to satisfy full screen display function on the basis of providing light transmission conditions for the optical sensors.

SUMMARY OF THE INVENTION

The present disclosure is to provide a display panel and a display device, which can provide light transmission conditions for the electronic component region to achieve a full display function.

In one embodiment, the present disclosure is to provide a display panel, the display panel includes a first display module and a second display module, a back of the first display module defines an electronic element region configured to install an optical sensor, the first display module includes a display region and a light-transmission region adjacent to the display region, and the light-transmission adjacent is arranged corresponding to the electronic element region.

The second display module is disposed in the light-transmission region, and is adjacent to the display region of the first display module, the second display module includes a plurality of pixel regions distributed in an array, each of the pixel regions is provided with a self-luminous micro-light-emitting unit, and any adjacent two of the micro-light-emitting units are spaced apart from each other.

In the display panel provided in the present disclosure, the display panel includes a growth substrate disposed between the second display module and the electronic element region, a shape and a size of an orthogonal projection of the growth substrate to the display panel match a shape and a size of an orthogonal projection of the light-transmission region to the display panel.

The micro-light-emitting unit in each of the pixel regions is formed on one side of the growth substrate away from the electronic element region.

In the display panel provided in the present disclosure, each of the pixel regions includes sub-pixel regions with different colors, and the micro-light-emitting unit includes a plurality of sub-micro-light-emitting units arranged in one-to-one correspondence with the sub-pixel regions with different colors.

The sub-micro-light-emitting units are spaced apart from each other.

In the display panel provided in the present disclosure, each of the sub-micro-light-emitting units includes a micro-light-emitting diode and a quantum dot color conversion unit, arranged on the growth substrate sequentially.

In the display panel provided in the present disclosure, the sub-pixel regions with different colors include a red sub-pixel region, a green sub-pixel region and a blue sub-pixel region.

The quantum dot color conversion unit corresponding to the red sub-pixel region is a red quantum dot color conversion unit, the quantum dot color conversion unit corresponding to the green sub-pixel region is a green quantum dot color conversion unit, and the quantum dot color conversion unit corresponding to the blue sub-pixel region is a blue quantum dot color conversion unit.

The micro-light-emitting diode comprising any one of a blue micro-light-emitting diode or a purple micro-light-emitting diode.

In the display panel provided in the present disclosure, the sub-pixel regions with different colors include a red sub-pixel region, a green sub-pixel region and a blue sub-pixel region;

The sub-micro-light-emitting unit corresponding to the green sub-pixel region includes a green micro-light-emitting diode, the sub-micro-light-emitting unit corresponding to the blue sub-pixel region includes a blue nano-ring micro-light-emitting diode, the sub-micro-light-emitting unit corresponding to the red sub-pixel region includes a red quantum dot nano-ring micro-light-emitting diode.

In the display panel provided in the present disclosure, the green micro-light-emitting diode includes a first N-type doping layer, a first multi-quantum well layer, and a first P-type doping layer disposed on the growth substrate sequentially.

The blue nano-ring micro-light-emitting diode includes a first N-type doping layer and a plurality of nano-rings disposed on the first N-type doping layer in an array, each of the nano-rings includes a second multi-quantum well layer and a second P-type doping layer sequentially disposed on the first N-type doping layer, materials of the first multi-quantum well layer and the second multi-quantum well layer are the same, and materials of the first P-type doping layer and the second P-type doping layer are the same.

The red quantum dot nano-ring micro-light-emitting diode includes the blue nano-ring micro-light-emitting diode and a red quantum dot color conversion layer covering the blue nano-ring micro-light-emitting diode.

In the display panel provided in the present disclosure, the micro-light-emitting unit includes a multi-color micro-light-emitting diode, and the multi-color micro-light-emitting diode emits red light, green light, and blue light respectively under control of different current signals and timing signals.

In the display panel provided in the present disclosure, the multi-color micro-light-emitting diode includes a second N-type doping layer, a multi-quantum well stacked layer, an electron blocking layer and a third P-type doping layer disposed on the growth substrate sequentially.

The multi-quantum well stacked layer includes a first carrier barrier layer, a blue light emission functional layer, a second carrier barrier layer, a green light emission functional layer, a third carrier barrier layer and a red light emission functional layer disposed on the second N-type doping layer sequentially.

In one embodiment, the present disclosure provides a display device, the display device includes a display panel and an optical sensor.

The display panel includes a first display module and a second display module, a back of the first display module defines an electronic element region configured to install an optical sensor, the first display module includes a display region and a light-transmission region adjacent to the display region, and the light-transmission region is correspondingly arranged corresponding to the electronic element region.

The second display module is disposed in the light-transmission region, and is adjacent to the display region of the first display module, the second display module includes a plurality of pixel regions distributed in an array, each of the pixel regions is provided with a self-luminous micro-light-emitting unit, and any adjacent two of the micro-light-emitting units are spaced apart from each other.

The optical sensor is disposed in the electronic element region on the back of the first display module.

In the display device provided in the present disclosure, the optical sensor includes any one of a fingerprint identification sensor, a camera, a face identification sensor, or a distance identification sensor.

In the display device provided in the present disclosure, the display device includes a growth substrate disposed between the second display module and the electronic element region, a shape and a size of an orthogonal projection of the growth substrate to the display panel match a shape and a size of an orthogonal projection of the light-transmission region to the display panel.

The micro-light-emitting unit in each of the pixel regions is formed on one side of the growth substrate away from the electronic element regions.

In the display device provided in the present disclosure, each of the pixel regions includes sub-pixel regions with different colors, and the micro-light-emitting unit includes a plurality of sub-micro-light-emitting units arranged in one-to-one correspondence with the sub-pixel regions with different colors.

The sub-micro-light-emitting units are spaced apart from each other.

In the display device provided in the present disclosure, each of the sub-micro-light-emitting units includes a micro-light-emitting diode and a quantum dot color conversion unit arranged on the growth substrate sequentially.

In the display device provided in the present disclosure, the sub-pixel regions with different colors include a red sub-pixel region, a green sub-pixel region, and a blue sub-pixel region.

The quantum dot color conversion unit corresponding to the red sub-pixel region is a red quantum dot color conversion unit, the quantum dot color conversion unit corresponding to the green sub-pixel region is a green quantum dot color conversion unit, the quantum dot color conversion unit corresponding to the blue sub-pixel region is a blue quantum dot color conversion unit.

The micro-light-emitting diode comprising any one of a blue micro-light-emitting diode or a purple micro-light-emitting diode.

In the display device provided in the present disclosure, the sub-pixel regions with different colors include a red sub-pixel region, a green sub-pixel region and a blue sub-pixel region.

The sub-micro-light-emitting unit corresponding to the green sub-pixel region includes a green micro-light-emitting diode, the sub-micro-light-emitting unit corresponding to the blue sub-pixel region includes a blue nano-ring micro-light-emitting diode, the sub-micro-light-emitting unit corresponding to the red sub-pixel region includes a red quantum dot nano-ring micro-light-emitting diode.

In the display device provided in the present disclosure, the green micro-light-emitting diode includes a first N-type doping layer, a first multi-quantum well layer and a first P-type doping layer disposed on the growth substrate sequentially.

The blue nano-ring micro-light-emitting diode includes a first N-type doping layer and a plurality of nano-rings disposed on the first N-type doping layer in an array, each of the nano-rings includes a second multi-quantum well layer and a second P-type doping layer sequentially disposed on the first N-type doping layer, materials of the first multi-quantum well layer and the second multi-quantum well layer are the same, and materials of the first P-type doping layer and the second P-type doping layer are the same;

The red quantum dot nano-ring micro-light-emitting diode includes the blue nano-ring micro-light-emitting diode and a red quantum dot color conversion layer covering the blue nano-ring micro-light-emitting diode.

In the display device provided in the present disclosure, the micro-light-emitting unit includes a multi-color micro-light-emitting diode, and the multi-color micro-light-emitting diode emits red light, green light and blue light respectively under control of different current signals and timing signals.

In the display device provided in the present disclosure, the multi-color micro-light-emitting diode includes a second N-type doping layer, a multi-quantum well stacked layer, an electron blocking layer and a third P-type doping layer disposed on the growth substrate sequentially.

The multi-quantum well stacked layer includes a first carrier barrier layer, a blue light emission functional layer, a second carrier barrier layer, a green light emission functional layer, a third carrier barrier layer and a red light emission functional layer disposed on the second N-type doping layer sequentially.

In the display device provided in the present disclosure, the first display module includes any one of a liquid crystal display module or an organic electroluminescence module.

Compared with the prior art, the present disclosure provides a display panel, comprising a first display module and a second display module, wherein the first display module can display an image through a self-luminous micro-lightemitting unit configured with a plurality of pixel regions, and the second display module is disposed in a light-transmission region of the first display module. When the display panel is in a state of displaying the image, the first display module can display the image in the display region, the second display module can display the image in the light-transmission region, and the image of the second display module and the image of the first display module form a full image. Moreover, as the micro-light-emitting unit is small and any adjacent two of the micro-light-emitting units are spaced apart from each other, light can enter an electronic element region from between any adjacent two of the micro-light-emitting units, thereby providing effective lighting conditions for the electronic element region when the display panel is in a state of collecting light. Meanwhile, as the light-transmission region is small, there is a fewer number of the micro-light-emitting units in the second display module, so there is no difficulty in mass transfer, yield, and detection.

BIREF DESCRIPTION OF THE SEVERAL VIEWS OF THE DRAWINGS

The embodiments of the present disclosure will be described hereinafter with reference to the accompanying drawings, the technical solutions and the beneficial effects of the present disclosure will be obviously.

DESCRIPTION OF SPECIFIC EMBODIMENTS OF THE INVENTION

Figure 1:
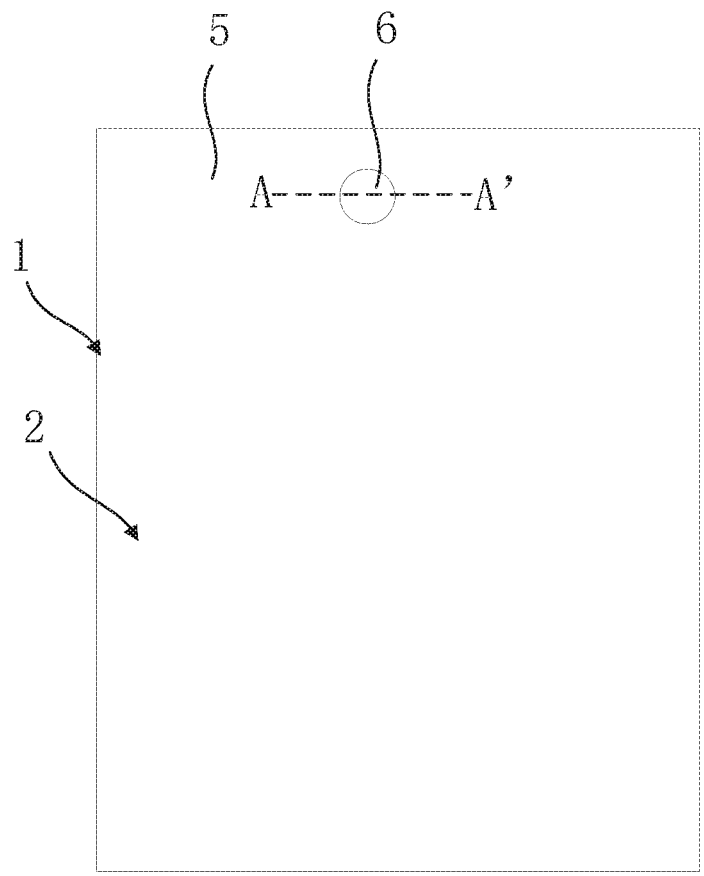
FIG. 1 is a vertical view structural diagram of a display panel provided by an embodiment of the present disclosure.
Figure 2:
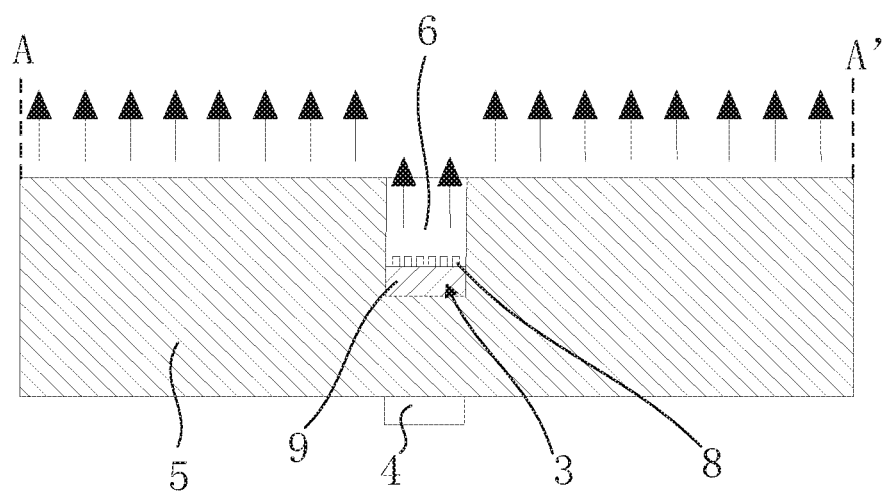
FIG. 2 is a cross-section structural diagram at A-A' in FIG. 1.

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

In the descriptions of the present disclosure, the terms "center", "longitudinal", "lateral", "length", "width", "thickness", "upper", "lower", "front", "back", "left", "right", "vertical", "horizontal", "top", "bottom", "inner", "outer", "clockwise", "counterclockwise" directions, and other indicated directions or the position relation are based on the orientation or position relation shown in the figures. Only for convenience of describing the present disclosure and the simplification of the description, rather than indicating or implying that the means or elements referred to have a specific orientation, so that the above directions of the present disclosure cannot be understood as limitations. In addition, the terms "first" and "second" are used only for purposes of description, and cannot be understood to indicate or imply a relative importance or to implicitly indicate the number of technical features indicated. Thus, the features "first" and "second" can be expressly or implicitly included in one or more of the features. In the description of the present disclosure, the meanings of "multiple" are two or more, unless specifically limited otherwise.

In descriptions of the present disclosure, terms "installed", "connected", and "connection" unless explicitly stated and limited, the terms should be interpreted broadly. For example, the connection can be fixedly connected, detachably connected, or integrally connected, and can be mechanically connected, electrically connected, or can be in communication with each other. The connection can be directly connected or indirectly connected through an intermediate medium, and can be internal connection of two elements or an interaction relationship between the two elements.

In the present disclosure, unless explicitly stated and defined otherwise, a first feature is "on" or "under" a second feature includes that the first feature can be in a direct contact with the second feature, or that the first and second features are not in a direct contact but are in contact with each other through additional features. Furthermore, a first feature is "above" or "under" a second feature includes that the first feature is right above or obliquely above the second feature, or that a height of the first feature is higher than that of the second feature. The first feature is "below" the second feature includes that the first feature is right below or obliquely below the second feature, or that a height of the first feature is lower than that of the second feature.

The following descriptions provide many different embodiments or examples for implementing different structures of the present disclosure. In order to simplify the descriptions of the present disclosure, components and arrangements of specific examples are described below. They are merely examples and are not intended to limit the present disclosure. In addition, reference numerals and reference letters can be repeated in different examples, and such repetition is for the purpose of simplicity and clarity, and is not intended to indicate the relationship between the various embodiments and/or arrangements discussed. In addition, the disclosure provides examples of various specific processes and materials, but one of ordinary skill in the art can realize other processes and the use of other materials.

Refer to FIGS. 1-4, an embodiment of the present disclosure provides a display panel 1, the display panel 1 includes a first display module 2 and a second display module 3. A back of the first display module 1 defines an electronic element region 4 configured to install an optical sensor, the first display module 1 includes a display region 5 and a light-transmission region 6 adjacent to the display region 5, and the light-transmission region 6 is arranged corresponding to the electronic element region 4. The second display module 3 is disposed in the light-transmission region 6, and the second display module 3 is adjacent to the display region 5 of the first display module 1. The second display module 3 includes a plurality of pixel regions 7 distributed in an array, each of the pixel regions 7 is provided with a self-luminous micro-light-emitting unit 8, and any adjacent two of the micro-light-emitting units 8 are spaced apart from each other. When the display panel 1 is in a state of displaying image, the first display module 2 displays a first image in the display region 5, and the second display module 3 displays a second image in the light-transmission region 6. For example, the first image and the second image can be assigned by driver chip (IC) algorithm inside the display panel 1, and the first image and the second image form a full image. When the display panel 1 is in a non-displaying state, external light can pass through and enter the electronic element region 4 from the micro-light-emitting units 8 of the second display module 3, thereby realizing lighting function.

It's understandable that any adjacent two of the micro-light-emitting units 8 are spaced apart from each other, in other words, each of the micro-light-emitting units 8 only occupies a part of the corresponding pixel regions 7. In each of the pixel regions 7, a region not occupied by the micro-light-emitting units 8 is the region that can transmit light, known as the light-transmission region 6. Due to a small size of the micro-light-emitting unit 8 which makes the light-transmission region 6 in each of the pixel regions 7 larger, when the display panel 1 is in a non-displaying state, there is a large enough light-transmitting area to allow outside light in, effectively ensuring the lighting effect of the light-transmission region 6. It's important to note that although the micro-light-emitting units 8 in the pixel regions 7 are disposed spaced apart, the micro-light-emitting units 8 are of self-luminous structure with high brightness, and appropriate spacing does not affect a normal display effect of the second display module 3.

Specifically, the micro-light-emitting unit 8 can be composed of a micro-light-emitting diode (micro LED) or a mini LED, and of course, other micro self-luminous display devices, and there are no restrictions made here.

Specifically, the display panel includes a growth substrate 9, the growth substrate 9 is disposed between the second display module 3 and the electronic element region 4. A shape and a size of an orthogonal projection of the growth substrate 9 in a direction perpendicular to the display panel 1 match a shape and a size of an orthogonal projection of the light-transmission region 6 in the direction perpendicular to the display panel 1 (in other words, the growth substrate 9 is seamlessly spliced with the display region 5 of the first display module 2 in the light-transmission region 6). The micro-light-emitting unit 8 in each of the pixel regions 7 is formed on one side of the growth substrate 9 away from the electronic element region 4, that is to say, the micro-light-emitting unit 8 of each of the pixel regions 7 of the second display module 3 is directly grown and formed on the growth substrate 9. Of course, the growth substrate 9 is equipped with a driving circuit. It should be noted that the growth substrate 9 with the micro-light-emitting unit 8 is cut according to a shape and the size of the light-transmission region 6. In addition, the whole cut block can be directly formed into a growth substrate 9 with the micro-light-emitting unit 8 assembled into the light-transmission region 6. This method of assembly can prevent a use of point-by-point assembly of conventional surface mount technology (SMT) machine or a transfer of the micro-light-emitting units 8 to a substrate by means of mass transfer (such as electrostatic force, fluid, adhesion, vacuum assembly, etc.).

If the SMT machine is used to assemble the micro-light-emitting units 8 one by one or if they are transferred to the substrate one by one via mass transfer, it is necessary to connect a cathode and anode of the micro-light-emitting units 8 to a driving array of the substrate through low-temperature binding technology using gold, nickel, tin, copper, indium, etc., and control an on/off state of each of the micro-light-emitting units 8 through an active or passive circuit to realize image display. However, such mass transfer assembly has many problems, such as low yield and difficult repair. The embodiments of the present disclosure directly forms the micro-light-emitting unit 8 on the growth substrate 9, and assembles the entire growth substrate 9 with the shape and the size matching the light-transmission region 6 to the light-transmission region 6, without having to transfer the micro-light-emitting unit 8, thereby eliminating a binding problem in a later stage, improving a yield of the second display module 3, and preventing a repair problem of the micro-light-emitting units 8.

Figure 3:
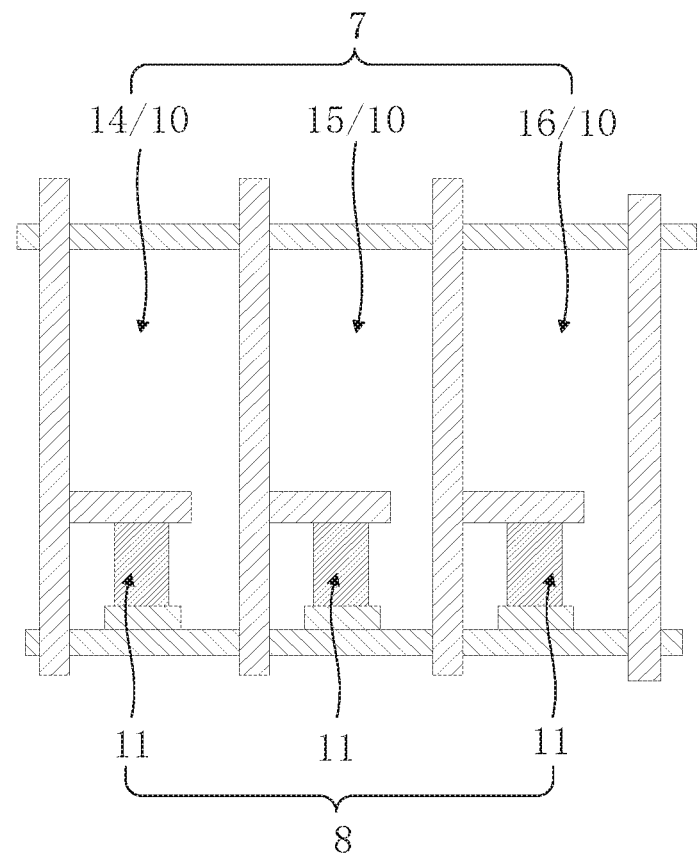
FIG. 3 is a vertical view structural diagram of a pixel region of a second display module provided by an embodiment of the present disclosure.

In an embodiment of the present disclosure, refer to FIG. 3, each of the pixel regions 7 includes sub-pixel regions 10 with different colors, the micro-light-emitting unit 8 includes a plurality of sub-micro-light-emitting units 11, and the sub-micro-light-emitting units 11 are arranged in one-to-one correspondence with the sub-pixel regions 10 with different colors. The sub-micro-light-emitting units 11 are spaced apart from each other. When the display panel 1 is in a non-displaying state, an external light can pass through the micro-light-emitting units 8, and the external light can pass through the sub-micro-light-emitting units 11 to enter the electronic element region 4, increasing the light-transmission region 6 and enhancing the lighting effect.

Figure 4:
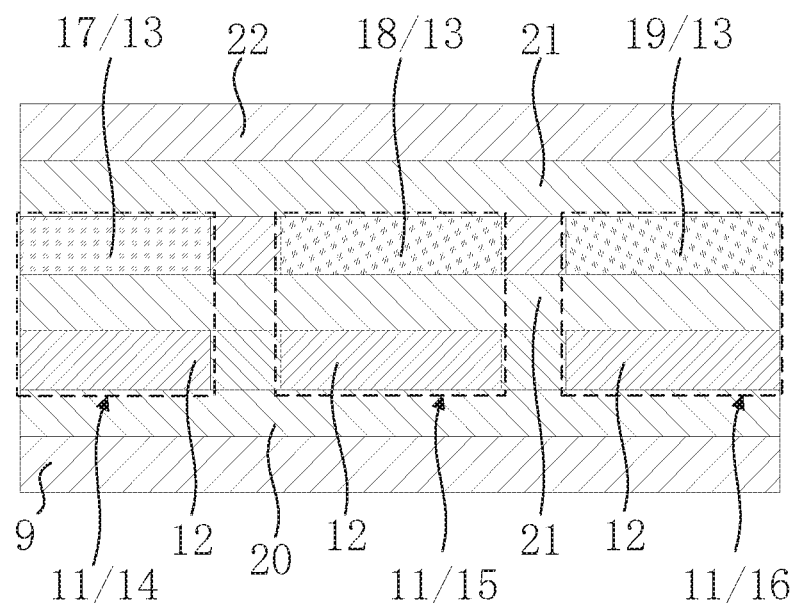
FIG. 4 is a cross-section structural diagram of the pixel region of the second display module provided by an embodiment of the present disclosure.

Specifically, refer to FIG. 4, each of the sub-micro-light-emitting units 11 includes a micro-light-emitting diode 12 and a quantum dot color conversion unit 13, the micro-light-emitting diode 12 and the quantum dot color conversion unit 13 are arranged on the growth substrate 9 sequentially, and the micro-light-emitting diode 12 can excite the quantum dot color conversion unit 13 to emit light of corresponding colors.

Specifically, the sub-pixel regions 10 with different colors include a red sub-pixel region 14, a green sub-pixel region 15, and a blue sub-pixel region 16. The quantum dot color conversion unit 13 corresponding to the red sub-pixel region 14 is a red quantum dot color conversion unit 17, the quantum dot color conversion unit 13 corresponding to the green sub-pixel region 15 is a green quantum dot color conversion unit 18, and the quantum dot color conversion unit 13 corresponding to the blue sub-pixel region 16 is a blue quantum dot color conversion unit 19. The micro-light-emitting diode 12 includes any one of a blue micro-light-emitting diode 12 or a purple micro-light-emitting diode 12.

Specifically, the micro-light-emitting diode 12 (the blue micro-light-emitting diode 12 or the purple micro-light-emitting diode 12) in each of the sub-pixel regions 10 is grown directly on the transparent growth substrate 9. As a quantum dot spray-coating technology, under a premise of ensuring uniformity, can achieve a spray-coating dimension of 3 μm×10 μm, which is far smaller than a current organic light emitting diode (OLED) pixel region, the red quantum dot color conversion unit 17, the green quantum dot color conversion unit 18, and the blue quantum dot color conversion unit 19 can therefore be coated on the corresponding the micro-light-emitting diode 12 by the quantum dot spray-coating technology to form the full-color micro-light-emitting diode 12 array based on blue or purple light excitation. Among them, the growth substrate 9 comprises a gallium nitride (GaN) substrate, and the growth substrate 9 and the micro-light-emitting diode 12 are also provided with a first buffer layer 20. A water-oxygen barrier layer 21 is also disposed between the micro-light-emitting diode 12 and the quantum dot color conversion unit 13, and a side of the quantum dot color conversion unit 13 away from the micro-light-emitting diode 12 is also provided with the water-oxygen barrier layer 21. The water-oxygen barrier layer 21 is also provided with a protective layer 22. It should be noted that the quantum dot color conversion unit 13 can also be replaced by other luminescent materials, and is not limited to quantum dot materials.

Specifically, as the light-transmission region 6 of the first display module 2 is smaller, the first display module 2 only needs to set up tens of thousands of the micro-light-emitting diode 12, eliminating the need for mass transfer of millions of micro-light-emitting diodes 12, which effectively prevents problems such as low yield and difficult repair. At a same time, since the formation of the micro-light-emitting diode 12 directly on the growth substrate 9 is only suitable for small-region growth, the smaller light-transmission region 6 of the first display module 2 provides conditions for the assembly of the entire growth substrate 9 formed with the micro-light-emitting diode 12 to the light-transmission region 6.

Specifically, the first display module 2 can be a liquid crystal display module, the liquid crystal display module includes an array substrate, a color film substrate, and a liquid crystal layer. The liquid crystal layer is disposed between the array substrate and the color film substrate, the second display module 3 can be disposed on the array substrate or on the color film substrate, and there are no restrictions here. When the first display module 2 is the liquid crystal display module, it is driven by a different driving circuit than the second display module 3. Of course, the liquid crystal display module can also be a color filter on array (COA) type liquid crystal display device.

Of course, the first display module 2 can also be an organic light emitting diode (OLED) display module, in other words, the first display module 2 can also be an electroluminescence display module, and the organic light emitting diode display module includes a plurality of the organic light emitting diodes in an array. The organic light emitting diode and the micro-light-emitting unit 8 can share a driving substrate, preventing inconsistency of driving circuit between the first display module 2 and the second display module 3 and reducing a number of driving circuits, thus reducing a routing width of routing lines, which is beneficial for narrowing a border and reducing costs. As a size of the micro-light-emitting diode 12 is much smaller than that of the organic light emitting diode, this makes the light-transmission region 6 have stronger light transmission. Furthermore, the micro-light-emitting diode 12 is based on inorganic luminescent material device, and has greater brightness and reliability, and can be used as a light compensating element (such as flash) or as a space array light source for projection structure light (such as a light source for 3D image recognition), thereby allowing the light-transmission region 6 of the display panel 1 have greater functional diversity and improving an effect of optical information collection.

In the embodiments of the present disclosure, the second display module 3 is disposed in the light-transmission region 6 of the first display module 2, and the second display module 3 can display an image by disposing the plurality of self-luminous micro-light-emitting units 8 in the pixel regions 7. When the display panel 1 is in a state of displaying image, the first display module 2 can display an image in the display region 5, the second display module 3 can display an image in the light-transmission region 6, and the image of the second display module 2 and the image of the first display module 1 form a full image. Moreover, any adjacent two of the micro-light-emitting units 8 are spaced apart from each other, and the sub-micro-light-emitting units 11 in each of the pixel regions 7 are spaced apart from each other for providing effective conditions of light collection in the electronic element region 4. When the display panel 1 is in a state of collecting light, light can enter the electronic element region 4 from between any adjacent two of the micro-light-emitting units 8. Furthermore, as the light-transmission region 6 is small and there is a fewer number of the micro-light-emitting units 8 in the second display module 3, there is no difficulty in mass transfer, yield, and detection. In addition, the second display module 3 composed of the micro-light-emitting diodes 12 is assembled into the light-transmission region 6 of the first display module 2 to realize the full screen display in a true sense, which can explore the binding and driving circuit of the micro light-emitting diodes 12, driving algorithms, image quality analysis, and many other photoelectric characteristics, and is conducive to promoting development of the micro-light-emitting diodes 12 display technology.

Figure 5:
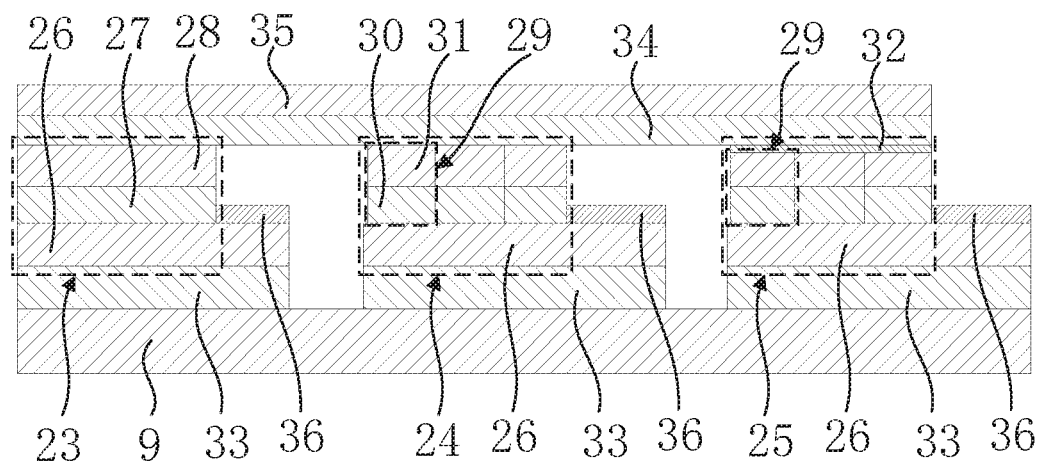
FIG. 5 is another cross-section structural diagram of the pixel region of the second display module provided by an embodiment of the present disclosure.
Figure 6:
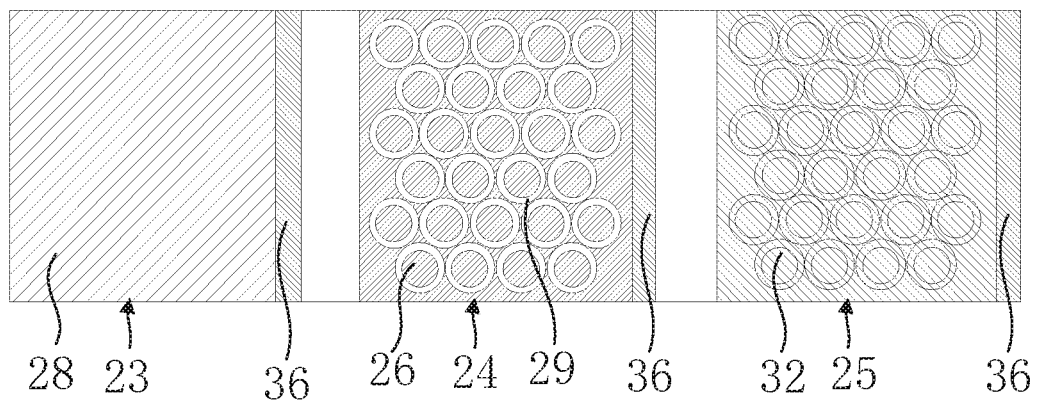
FIG. 6 is a vertical view structural diagram of a micro-light-emitting unit provided by an embodiment of the present disclosure.

Refer to FIG. 3, FIG. 5, and FIG. 6, an embodiment of the present disclosure further provides a display panel 1, the difference from the above embodiment is that the sub-pixel regions 10 with different colors include a red sub-pixel region 14, a green sub-pixel region 15, and a blue sub-pixel region 16. The sub-micro-light-emitting unit 11 corresponding to the green sub-pixel region 15 includes a green micro-light-emitting diode 23, the sub-micro-light-emitting unit 11 corresponding to the blue sub-pixel region 16 includes a blue nano-ring micro-light-emitting diode 24, and the sub-micro-light-emitting unit 11 corresponding to the red sub-pixel region 14 includes a red quantum dot nano-ring micro-light-emitting diode 25.

Specifically, the green micro-light-emitting diode 23 includes a first N-type doping layer 26, a first multi-quantum well layer 27, and a first P-type doping layer 28 disposed on the growth substrate 9 sequentially. The blue nano-ring micro-light-emitting diode 24 includes a first N-type doping layer 26 and a plurality of nano-rings 29 disposed on the first N-type doping layer 26 in an array. Each of the nano-rings 29 includes a second multi-quantum well layer 30 and a second P-type doping layer 31 sequentially disposed on the first N-type doping layer 26. Materials of the first multi-quantum well layer 27 and the second multi-quantum well layer 30 are the same, and materials of the first P-type doping layer 28 and the second P-type doping layer 31 are the same. The red quantum dot nano-ring micro-light-emitting diode 25 includes the blue nano-ring micro-light-emitting diode 24 and a red quantum dot color conversion layer 32 covering the blue nano-ring micro-light-emitting diode 24.

Specifically, the green micro-light-emitting diode 23, the blue nano-ring micro-light-emitting diode 24, and the red quantum dot nano-ring micro-light-emitting diode 25 are grown directly on the transparent growth substrate 9. The growth substrate 9 includes a sapphire base, and of course, is not limited to this. A second buffer layer 33 is also provided between the green micro-light-emitting diode 23, the blue nano-ring micro-light-emitting diode 24, and the red quantum dot nano-ring micro-light-emitting diode 25 and the growth substrate 9, and the second buffer layer 33 is located in a buffer layer below the green micro-light-emitting diode 23, the blue nano-ring micro-light-emitting diode 24, and the red quantum dot nano-ring micro-light-emitting diode 25 in a spaced-apart manner. A side of the green micro-light-emitting diode 23, the blue nano-ring micro-light-emitting diode 24, and the red quantum dot nano-ring micro-light-emitting diode 25 away from the growth substrate 9 is provided with a whole-layer transparent conducting layer 34 and a first electrode 35. A second electrode 36 is further provided on the first N-type doping layer 26 of each micro-light-emitting diode 12.

Specifically, material of each layer of the blue nano-ring micro-light-emitting diode 24 corresponds to material of each layer of the green micro-light-emitting diode 23. The difference is that the blue nano-ring micro-light-emitting diode 24 forms a nano-ring 29 including the second multi-quantum well layer 30 and the second P-type doping layer 31 through a quantum confined Stark effect. The nano-ring 29 can use a strain relaxation effect to convert green light into blue light, so the blue nano-ring micro-light-emitting diode 24 emits blue light. The red quantum dot nano-ring micro-light-emitting diode includes the blue nano-ring micro-light-emitting diode 24 and a red quantum dot color conversion layer 32. The red quantum dot color conversion layer 32 covers the blue nano-ring micro-light-emitting diode 24, and the blue light emitted by the blue nano-ring micro-light-emitting diode 24 can excite the red quantum dot color conversion layer 32 to emit red light. The blue nano-ring micro-light-emitting diode 24 utilizes a non-radiative resonance energy transfer (NRET) mechanism to enhance a color conversion efficiency of the red quantum dot color conversion layer 32.

Specifically, the red quantum dot color conversion layer 32 of the red quantum dot nano-ring micro-light-emitting diode 25 can be coated on a surface of the nano-ring 29 corresponding to the red sub-pixel region 14 by quantum dot spray-coating technology.

In an embodiment of the present disclosure, the second display module 3 is disposed in the light-transmission region 6 of the first display module 2, the second display module 3 can display an image through the self-luminous green micro-light-emitting diode 23, blue nano-ring micro-light-emitting diode 24, and red quantum dot nano-ring micro-light-emitting diode 25 disposed in each of the pixel regions 7. When the display panel 1 is in a state of displaying image, the first display module 2 can display an image in the display region 5, the second display module 3 can display an image in the light-transmission region 6, and the image of the second display module 2 and the image of the first display module 1 form a full image. Moreover, any adjacent two of the micro-light-emitting units 8 are spaced apart from each other, and the green micro-light-emitting diode 23, the blue nano-ring micro-light-emitting diode 24, and the red quantum dot nano-ring micro-light-emitting diode 25 of each of the pixel regions 7 are also spaced apart from each other for providing effective conditions of light collection in the electronic element region 4. When the display panel 1 is in a state of collecting light, light can enter the electronic element region 4 from between any adjacent two of the micro-light-emitting units 8. Furthermore, as the light-transmission region 6 is small and there is a fewer number of the micro-light-emitting units 8 in the second display module 3, there is no difficulty in mass transfer, yield, and detection. In addition to the above advantages, in the embodiment, the blue nano-ring micro-light-emitting diode 24 and the red quantum dot nano-ring micro-light-emitting diode 25 have high light conversion efficiency, and only one color quantum dot color conversion layer needs to be spray-coated, which reduces quantum dot material usage.

Figure 7:
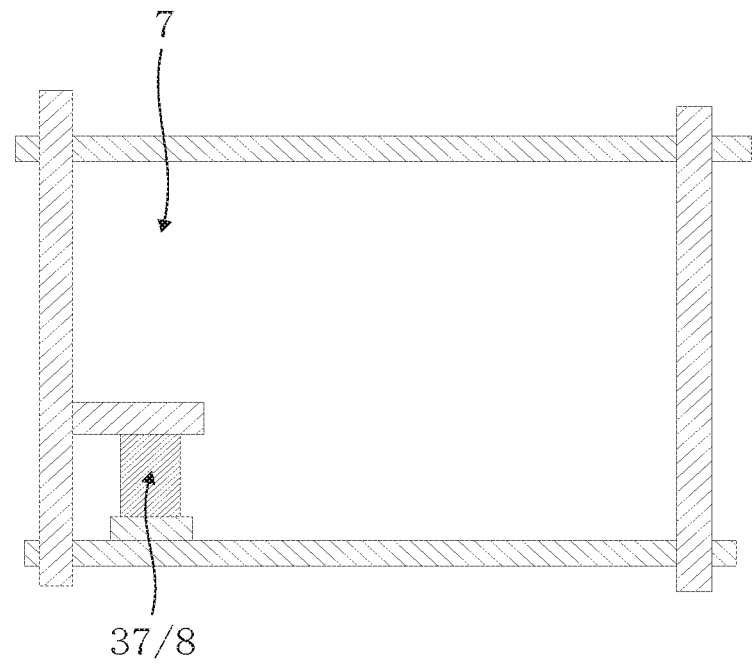
FIG. 7 is another vertical view structural diagram of the pixel region of the second display module provided by an embodiment of the present disclosure.
Figure 8:
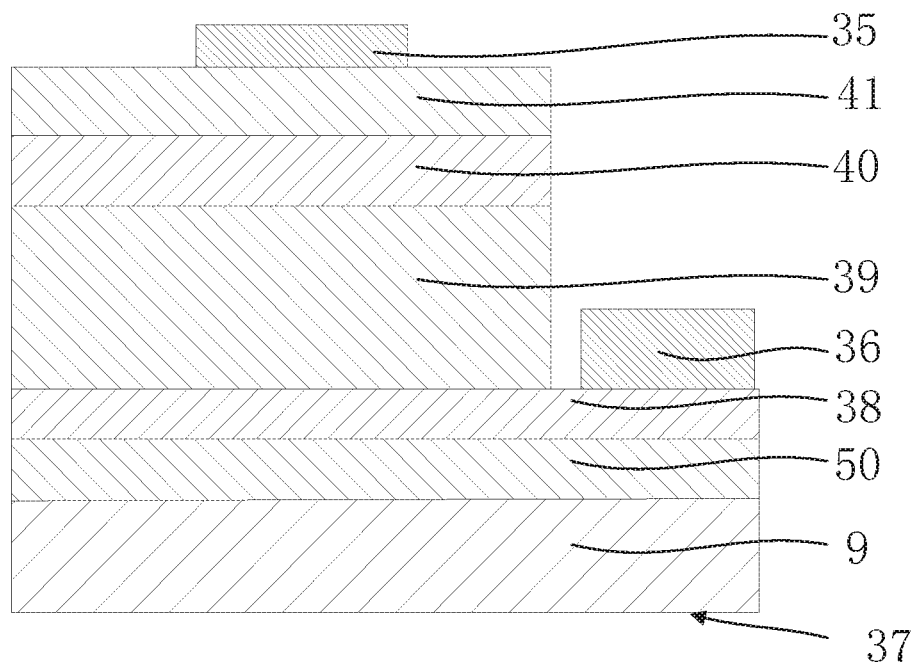
FIG. 8 is a cross-section structural diagram of a multi-color micro-light-emitting diode provided by an embodiment of the present disclosure.
Figure 9:
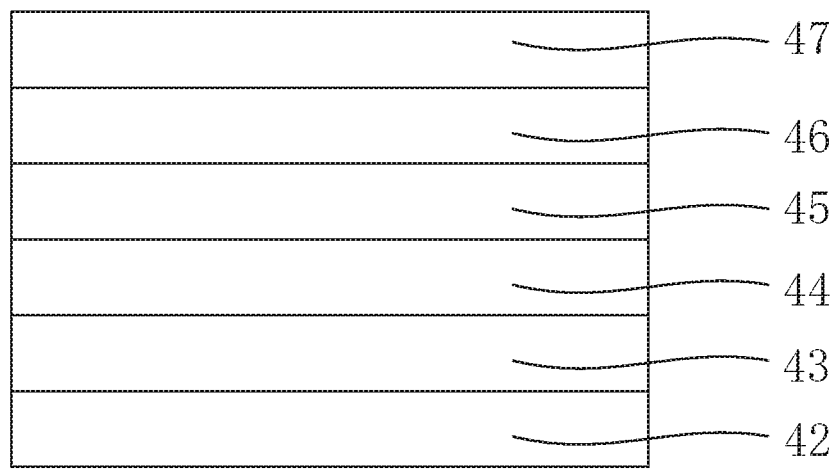
FIG. 9 is a cross-section structural diagram of a multi-quantum well stacked layer of the multi-color micro-light-emitting diode provided by an embodiment of the present disclosure.

Refer to FIGS. 7-9, an embodiment of the present disclosure further provides a display panel 1, the difference from the above embodiment is that the micro-light-emitting unit 8 includes a multi-color micro-light-emitting diode 37, and the multi-color micro-light-emitting diode 37 includes a second N-type doping layer 38, a multi-quantum well stacked layer 39, an electron blocking layer 40, and a third P-type doping layer 41. The second N-type doping layer 38, the multi-quantum well stacked layer 39, the electron blocking layer 40, and the third P-type doping layer 41 are disposed on the growth substrate 9 sequentially. The multi-quantum well stacked layer 39 includes a first carrier blocking layer 42, a blue light-emitting functional layer 43, a second carrier blocking layer 44, a green light emitting functional layer 45, a third carrier blocking layer 46, and a red light-emitting functional layer 47 disposed on the second N-type doping layer 38 sequentially. The multi-color micro-light-emitting diode 37 emits red light, green light, and blue light respectively under the control of different current signals and timing signals. That is to say, each of the pixel regions 7 is provided with only one multi-color micro-light-emitting diode 37 to achieve full color display.

Specifically, the growth substrate 9 includes any one of a GaN substrate, a sapphire substrate, or a silicon carbide (SiC) substrate. The multi-color micro-light-emitting diode 37 of each of the pixel regions 7 is grown on the growth substrate 9, and a third buffer layer 50 is further provided between the growth substrate 9 and the second N-type doping layer 38. The third P-type doping layer 41 is further away from the electron blocking layer 40. A second electrode 36 is further provided on the second N-type doping layer 38.

Specifically, the blue light-emitting functional layer 43 includes a first quantum barrier layer, a blue excitation layer, and a second quantum barrier layer that are sequentially stacked on the first carrier blocking layer 42. The green light-emitting functional layer 45 includes a third quantum barrier layer, a green light excitation layer, and a fourth quantum barrier layer that are sequentially stacked on the second carrier blocking layer 44. The red light-emitting functional layer 47 includes a fifth quantum barrier layer, a red light excitation layer, and a sixth quantum barrier layer that are sequentially stacked on the third carrier blocking layer 46.

Specifically, the composition, thickness, and doping concentration of the first carrier blocking layer 42, the second carrier blocking layer 44, and the third carrier blocking layer 46 are different. When selective absorption of the first carrier blocking layer 42, the second carrier blocking layer 44, and the third carrier blocking layer 46 is used to drive a single multi-color micro-light-emitting diode 37 with current signals of different sizes, a single multi-color micro-light-emitting diode 37 can emit different colors of light. For example, using respective current signals of 15 mA, 200 mA, and 400 mA to drive a single multi-color micro-light-emitting diode 37 can produce red light with a wavelength of 650 nm, green light with a wavelength of 530 nm, and blue light with a wavelength of 460 nm, respectively, and the emitted light can cover standard red green blue (SRGB) color gamut. Therefore, each of the multi-color micro-light-emitting diodes 37 can form white light by adjusting the driving clock signal and mixing light in time. Such type of the multi-color micro-light-emitting diode 37 with integrated property of light emission wavelength being dynamically adjusted with the drive current has a good application prospect.

Specifically, taking a size of 60 μm×60 μm of a single pixel region 7 as an example, in the case where the second display module 3 uses red, green, and blue (RGB) three-color micro-light-emitting diodes for display respectively, if the red sub-pixel region 14, the green sub-pixel region 15, and the blue sub-pixel region 16 have a same size and are all 15 μm×15 μm, an aperture ratio of the pixel region 7 is 81.25% without considering aperture loss of the circuit. Under the same resolution, in a case where the second display module 3 uses multi-color micro-light-emitting diodes for display, the aperture ratio of the pixel region 7 is 93.75%, which is much higher than the former. That is, the light-transmission region of each of the pixel regions 7 is effectively improved. Meanwhile, if the same aperture ratio is used, the resolution of the second display module 3 displayed by the multi-color-micro LEDs is three times that of the second display module 3 displayed by the RGB tri-color micro LEDs. Therefore, this embodiment can effectively improve the resolution of the light-transmission region 6 under the same aperture ratio, thereby improving the display effect.

In this embodiment, a single multi-color micro-light-emitting diode is used instead of the RGB tri-color micro-light-emitting diode. On the one hand, like the above-mentioned embodiments, it can provide a basis for the light-transmission conditions for the electronic element region 4 on the back of the display panel 1. On the other hand, each of the pixel regions 7 is divided into a red sub-pixel region 14, a green sub-pixel region 15, and a blue sub-pixel region 16, and is set in each of the sub-pixel regions 10 for the micro-light-emitting diode 12. In this embodiment, only one of the multi-color micro-light-emitting diodes 37 is provided in each of the pixel regions 7, so that a number of micro light-emitting diodes 12 (chips) is reduced by two-thirds, thereby significantly reducing a number of times for the transfer of the micro-light-emitting diodes 12 and a number of bonding and repairing. Therefore, this embodiment can effectively reduce the cost, specifically the production cost, transfer cost, bonding cost, and repairing cost, of the micro-light-emitting diode 12 (chip). On the other hand, in this embodiment, each of the pixel regions 7 does not need to provide a plurality of sub-pixel regions 10, which is equivalent to reducing a number of the sub-pixel regions 10 (that is, reducing number of micro-light-emitting diodes 12), which can effectively reduce a number of driving circuits, a width of the wiring arrangement, difficulty of driving design, and a border width, thereby facilitating an increase of the screen ratio (narrow border), and achieving a full screen display. Meanwhile, when the multi-color micro-light-emitting diode 37 of this embodiment is used for transparent display, it can not only keep the display effect unchanged, but also significantly increase the screen ratio of the display panel 1.

Figure 10:
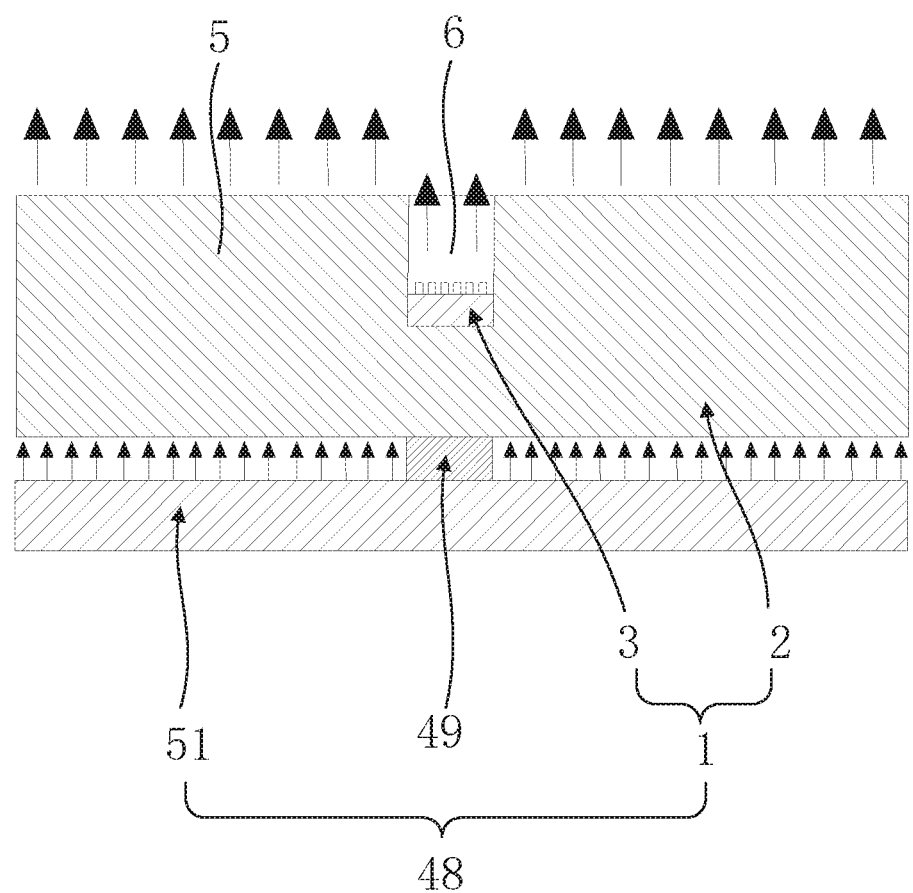
FIG. 10 is a structural diagram of a display device provided by an embodiment of the present disclosure.

Refer to FIG. 10, an embodiment of the present disclosure also provides a display device 48, the display device 48 includes any one of the display panels 1 in the above embodiments, and the electronic element region 4 disposed on the back of the first display module 2 of the optical sensor 49.

Specifically, the optical sensor 49 includes any one of a fingerprint recognition sensor, a camera, a face recognition sensor, or a distance recognition sensor, of course, the type of the optical sensor 49 is not limited to this.

Specifically, the display device 48 can be a liquid crystal display device, that is, the first display module 2 of the display panel 1 is a liquid crystal display module. Refer to FIG. 5, the display device 48 further includes a backlight module 51, and the backlight module 51 provides backlight for the first display module. The optical sensor 49 is disposed between the backlight module 51 and the display panel 1. Of course, the optical sensor 49 may be embedded in the backlight module 51. It should be noted that the display device 48 may be an OLED display device, that is, the first display module 2 of the display panel 1 is an OLED display module, which is not limited herein.

When the display device 48 is in the state of displaying image, the first display module 2 displays a first image in the display region 5, and the second display module 3 displays a second image in the light-transmission region 6. For example, the first image and the second image can be assigned by the driver chip (IC) algorithm inside the display panel 1, and the first image and the second image form a full image. When the display device 48 is in the optical recognition state, external light can pass through between the plurality of micro-light-emitting units 8 of the second display module 3 in the light-transmission region 6, enter the electronic element region 4, and be received by the optical sensor 49 to realize fingerprint recognition, camera, facial recognition, or distance recognition, according to different structures of the optical sensor 49.

In this embodiment, the light-transmission region 6 can be used for display in the display state to maintain the integrity of the display screen of the display panel 1, so as to realize a true full screen display. In the optical recognition state, a sufficiently large light-transmission region 6 can be provided so that the optical sensor 49 on the back of the display panel 1 has sufficient lighting, so as to perform normal and accurate optical recognition. The second display module 3 of the light-transmission region 6 can be composed of the micro-light-emitting diode 12, and since the micro-light-emitting diode 12 is a device based on phosphors and has higher brightness and better reliability and can be used as a light compensation element or a spatial array light source for projecting structured light, it is beneficial for improving the optical recognition effect of the optical sensor 49. Therefore, the display device 48 of the present disclosure can not only realize a real full-screen display, but also achieve a better optical recognition function under the screen.

In the above embodiments, the description of each embodiment has its own emphasis, for a part that is not detailed in an embodiment, you can refer to the related descriptions of other embodiments.

The display panel and display device provided by the embodiments of the present disclosure are described in detail above, specific examples are used to explain the principle and implementation of the present disclosure, the descriptions of the above embodiments are only used to help understand the present disclosure technical solutions and their core ideas. Those of ordinary skill in the art should understand that they can still modify the technical solutions described in the foregoing embodiments, or equivalently replace some of the technical features. These modifications or replacements, and the essence of the corresponding technical solutions does not deviate from the scope of the technical solutions of the embodiments of the present application.

What is claimed is:
1. A display panel, comprising:
  a first display module and a second display module, wherein a back of the first display module defines an electronic element region configured to install an optical sensor, the first display module comprises a display region and a light-transmission region adjacent to the display region, and the light-transmission region is arranged corresponding to the electronic element region; and the second display module is disposed in the light-transmission region and is adjacent to the display region of the first display module, the second display module comprises a plurality of pixel regions distributed in an array, each of the pixel regions is provided with a self-luminous micro-light-emitting unit, and any adjacent two of the micro-light-emitting units are spaced apart from each other.

2. The display panel of claim 1, wherein a growth substrate is disposed between the second display module and the electronic element region, a shape and a size of an orthogonal projection of the growth substrate in a direction perpendicular to the display panel match a shape and a size of an orthogonal projection of the light-transmission region in the direction perpendicular to the display panel; and the micro-light-emitting unit in each of the pixel regions is formed on one side of the growth substrate away from the electronic element region.

3. The display panel of claim 2, wherein each of the pixel regions comprises sub-pixel regions with different colors, and the micro-light-emitting units comprise a plurality of sub-micro-light-emitting units arranged in one-to-one correspondence with the sub-pixel regions with different colors; and the sub-micro-light-emitting units are spaced apart from each other.

4. The display panel of claim 3, wherein each of the sub-micro-light-emitting units comprises a micro-light-emitting diode and a quantum dot color conversion unit arranged on the growth substrate sequentially.

5. The display panel of claim 4, wherein the sub-pixel regions with different colors comprise a red sub-pixel region, a green sub-pixel region, and a blue sub-pixel region;

the quantum dot color conversion unit corresponding to the red sub-pixel region is a red quantum dot color conversion unit, the quantum dot color conversion unit corresponding to the green sub-pixel region is a green quantum dot color conversion unit, and the quantum dot color conversion unit corresponding to the blue sub-pixel region is a blue quantum dot color conversion unit; and the micro-light-emitting diodes comprise any one of a blue micro-light-emitting diode or a purple micro-light-emitting diode.

6. The display panel of claim 3, wherein the sub-pixel regions with different colors comprise a red sub-pixel region, a green sub-pixel region, and a blue sub-pixel region; and the sub-micro-light-emitting unit corresponding to the green sub-pixel region comprises a green micro-light-emitting diode, the sub-micro-light-emitting unit corresponding to the blue sub-pixel region comprises a blue nano-ring micro-light-emitting diode, and the sub-micro-light-emitting unit corresponding to the red sub-pixel region comprises a red quantum dot nano-ring micro-light-emitting diode.

7. The display panel of claim 6, wherein the green micro-light-emitting diode comprises a first N-type doping layer, a first multi-quantum well layer, and a first P-type doping layer disposed on the growth substrate sequentially;

the blue nano-ring micro-light-emitting diode comprises the first N-type doping layer and a plurality of nano-rings disposed on the first N-type doping layer in an array, each of the nano-rings comprises a second multi-quantum well layer and a second P-type doping layer sequentially disposed on the first N-type doping layer, materials of the first multi-quantum well layer and the second multi-quantum well layer are the same, and materials of the first P-type doping layer and the second P-type doping layer are the same; and the red quantum dot nano-ring micro-light-emitting diode comprises the blue nano-ring micro-light-emitting diode and a red quantum dot color conversion layer covering the blue nano-ring micro-light-emitting diode.

8. The display panel of claim 2, wherein the micro-light-emitting units comprise a multi-color micro-light-emitting diode, and the multi-color micro-light-emitting diode emits red light, green light, and blue light respectively under control of different current signals and timing signals.

9. The display panel as claimed in claim 8, wherein the multi-color micro-light-emitting diode comprises a second N-type doping layer, a multi-quantum well stacked layer, an electron blocking layer, and a third P-type doping layer disposed on the growth substrate sequentially; and the multi-quantum well stacked layer comprises a first carrier barrier layer, a blue light emission functional layer, a second carrier barrier layer, a green light emission functional layer, a third carrier barrier layer, and a red light emission functional layer disposed on the second N-type doping layer sequentially.

10. A display device, comprising the display panel of claim 1 and the optical sensor disposed in the electronic element region on the back of the first display module.

11. The display device of claim 10, wherein the optical sensor comprises any one of a fingerprint identification sensor, a camera, a facial identification sensor, or a distance identification sensor.

12. The display device of claim 10, wherein a growth substrate is disposed between the second display module and the electronic element region, a shape and a size of an orthogonal projection of the growth substrate in a direction perpendicular to the display panel match a shape and a size of an orthogonal projection of the light-transmission region in the direction perpendicular to the display panel; and the micro-light-emitting unit in each of the pixel regions is formed on one side of the growth substrate away from the electronic element region.

13. The display device of claim 12, wherein each of the pixel regions comprises sub-pixel regions with different colors, and the micro-light-emitting units comprise a plurality of sub-micro-light-emitting units arranged in one-to-one correspondence with the sub-pixel regions with different colors; and the sub-micro-light-emitting units are spaced apart from each other.

14. The display device of claim 13, wherein each of the sub-micro-light-emitting units comprises a micro-light-emitting diode and a quantum dot color conversion unit arranged on the growth substrate sequentially.

15. The display device of claim 14, wherein the sub-pixel regions with different colors comprise a red sub-pixel region, a green sub-pixel region, and a blue sub-pixel region;

the quantum dot color conversion unit corresponding to the red sub-pixel region is a red quantum dot color conversion unit, the quantum dot color conversion unit corresponding to the green sub-pixel region is a green quantum dot color conversion unit, and the quantum dot color conversion unit corresponding to the blue sub-pixel region is a blue quantum dot color conversion unit; and the micro-light-emitting diodes comprise any one of a blue micro-light-emitting diode or a purple micro-light-emitting diode.

16. The display device of claim 13, wherein the sub-pixel regions with different colors comprise a red sub-pixel region, a green sub-pixel region, and a blue sub-pixel region; and the sub-micro-light-emitting unit corresponding to the green sub-pixel region comprises a green micro-light-emitting diode, the sub-micro-light-emitting unit corresponding to the blue sub-pixel region comprises a blue nano-ring micro-light-emitting diode, and the sub-micro-light-emitting unit corresponding to the red sub-pixel region comprises a red quantum dot nano-ring micro-light-emitting diode.

17. The display device of claim 16, wherein the green micro-light-emitting diode comprises a first N-type doping layer, a first multi-quantum well layer, and a first P-type doping layer disposed on the growth substrate sequentially;

the blue nano-ring micro-light-emitting diode comprises the first N-type doping layer and a plurality of nano-rings disposed on the first N-type doping layer in an array, each of the nano-rings comprises a second multi-quantum well layer and a second P-type doping layer sequentially disposed on the first N-type doping layer, materials of the first multi-quantum well layer and the second multi-quantum well layer are the same, and materials of the first P-type doping layer and the second P-type doping layer are the same; and the red quantum dot nano-ring micro-light-emitting diode comprises the blue nano-ring micro-light-emitting diode and a red quantum dot color conversion layer covering the blue nano-ring micro-light-emitting diode.

18. The display device of claim 12, wherein the micro-light-emitting units comprise a multi-color micro-light-emitting diode, and the multi-color micro-light-emitting diode emits red light, green light, and blue light respectively under control of different current signals and timing signals.

19. The display device of claim 18, wherein the multi-color micro-light-emitting diode comprises a second N-type doping layer, a multi-quantum well stacked layer, an electron blocking layer, and a third P-type doping layer disposed on the growth substrate sequentially; and the multi-quantum well stacked layer comprises a first carrier barrier layer, a blue light emission functional layer, a second carrier barrier layer, a green light emission functional layer, a third carrier barrier layer, and a red light emission functional layer disposed on the second N-type doping layer sequentially.

20. The display device of claim 10, wherein the first display module comprises any one of a liquid crystal display module or an organic electroluminescence display module.

* * * * *